(12) United States Patent
Hirai

(10) Patent No.: US 7,297,622 B2
(45) Date of Patent: Nov. 20, 2007

(54) WIRING METHOD

(75) Inventor: Toshimitsu Hirai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 179 days.

(21) Appl. No.: 11/156,578

(22) Filed: Jun. 21, 2005

(65) Prior Publication Data

US 2006/0003564 A1    Jan. 5, 2006

(30) Foreign Application Priority Data

Jul. 5, 2004    (JP) ............... 2004-198037

(51) Int. Cl.
*H01L 21/3205* (2006.01)
*H01L 21/4763* (2006.01)

(52) U.S. Cl. .................. 438/589; 438/585

(58) Field of Classification Search ........ 438/585, 438/587, 589, 504, 597, 614, 618
See application file for complete search history.

(56) References Cited

U.S. PATENT DOCUMENTS

| | | | | |
|---|---|---|---|---|
| 4,935,792 | A | * | 6/1990 | Tanaka et al. ............... 257/59 |
| 5,726,088 | A | * | 3/1998 | Yanagiya et al. ........... 438/270 |
| 6,994,422 | B2 | | 2/2006 | Park et al. |
| 2004/0137159 | A1 | | 7/2004 | Nakamura et al. |
| 2004/0201048 | A1 | * | 10/2004 | Seki et al. ................. 257/294 |
| 2005/0003640 | A1 | * | 1/2005 | Ushiyama et al. .......... 438/502 |
| 2005/0153468 | A1 | * | 7/2005 | Gupta et al. ................ 438/21 |

FOREIGN PATENT DOCUMENTS

| | | |
|---|---|---|
| JP | 2005-268761 A | 9/2005 |
| KR | 10-2003-0082261 | 10/2003 |
| KR | 10-2004-0044113 | 5/2004 |

OTHER PUBLICATIONS

Hayes et al., Development and Application by Ink-Jet Printing of Advanced Packaging Materials, 1999 International Symposium on Advanced Packaging Materials, pp. 88-93.*

* cited by examiner

*Primary Examiner*—Asok K. Sarkar
*Assistant Examiner*—Jenny L. Wagner
(74) *Attorney, Agent, or Firm*—Global IP Counselors, LLP

(57) ABSTRACT

A method of forming a wiring in a thin-film transistor includes a step of providing a bank having a groove defined thereon, a step of placing a liquid material in a wiring formation area of the by depositing droplets of the liquid material, and a step of placing the liquid material in a secondary area. The groove has the wiring formation area and the secondary area that are contiguously connected with each other. The liquid material contains a structural material for the wiring. The per unit amount of the liquid material placed in the secondary area is smaller than the per unit amount of the liquid material deposited in the wiring formation area.

8 Claims, 10 Drawing Sheets

WIRING METHOD

BACKGROUND OF THE INVENTION

1. Field of the Invention

The present invention generally relates to a wiring method. More specifically, the present invention relates to a wiring method to be performed on a thin film transistor.

2. Background Information

As is well known, a thin-film transistor (hereinafter also referred to as a TFT) has a configuration including an insulating film, a layer on which a drain electrode and a source electrode are formed, and a layer on which a gate electrode. The drain electrode/source electrode layer and the gate electrode layer are disposed on either side of the insulating film. When manufacturing such a thin-film transistor, the insulating film is preferably made thinner in order to improve productivity. However, since such an insulating film fulfills the role of preventing short-circuiting between the drain electrode/source electrode and the gate electrode, reducing the thickness of the insulating film can sometimes result in insufficient insulation between the drain electrode/source electrode and the gate electrode.

Japanese Patent Application Publication No. 2002-190598 discloses a technique for resolving such problems. Specifically, the thickness of the gate electrode is reduced by adjusting the gradation of exposure using a so-called gray tone exposure technique, such that the portion of the insulating film on the gate electrode is made relatively thick to secure the requisite thickness of the insulating film between the drain electrode/source electrode and the gate electrode.

Recently a method has been proposed wherein a pattern is formed on a substrate using so-called ink jetting, which is a droplet ejection method for ejecting liquid material in a droplet form from a liquid ejection head. In this method, the liquid material (functional liquid) with which the pattern is to be formed is deposited in the shape of the pattern directly onto the substrate, and is then converted into the pattern using a heat treatment or a laser irradiation. This method has merits in that the need for photolithography is eliminated, the process is greatly simplified, and a lesser amount of raw material is required.

It is preferable to reduce the thickness of the insulating film described above in order to improve the productivity even when a TFT is manufactured by applying such a droplet ejection method to form gate wiring or the like, where part of such gate wiring is also used as a gate electrode. In actuality, among techniques for forming gate wiring or the like using droplet ejection, no technique has yet been proposed that would secure the required thickness of the insulating film formed on the gate electrode while reducing the thickness of the gate electrode.

In view of the above, it will be apparent to those skilled in the art from this disclosure that there exists a need for an improved wiring method that overcomes the problems of the conventional art. This invention addresses this need in the art as well as other needs, which will become apparent to those skilled in the art from this disclosure.

SUMMARY OF THE INVENTION

An object of the present invention is to provide a wiring method that reduces the occurrence of insufficient insulation even when the thickness of the insulation film is reduced.

A method of forming a wiring in a thin-film transistor in accordance with the present invention includes steps of: providing a bank having a groove defined thereon, the groove having a wiring formation area and a secondary area that is contiguously connected with the wiring formation area; placing a liquid material in the wiring formation area by depositing droplets of the liquid material, the liquid material containing a structural material for the wiring; and placing the liquid material in the secondary area, a per unit amount of the liquid material placed in the secondary area being smaller than a per unit amount of the liquid material deposited in the wiring formation area.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure.

DETAILED DESCRIPTION OF THE PREFERRED EMBODIMENTS

Figure 1:
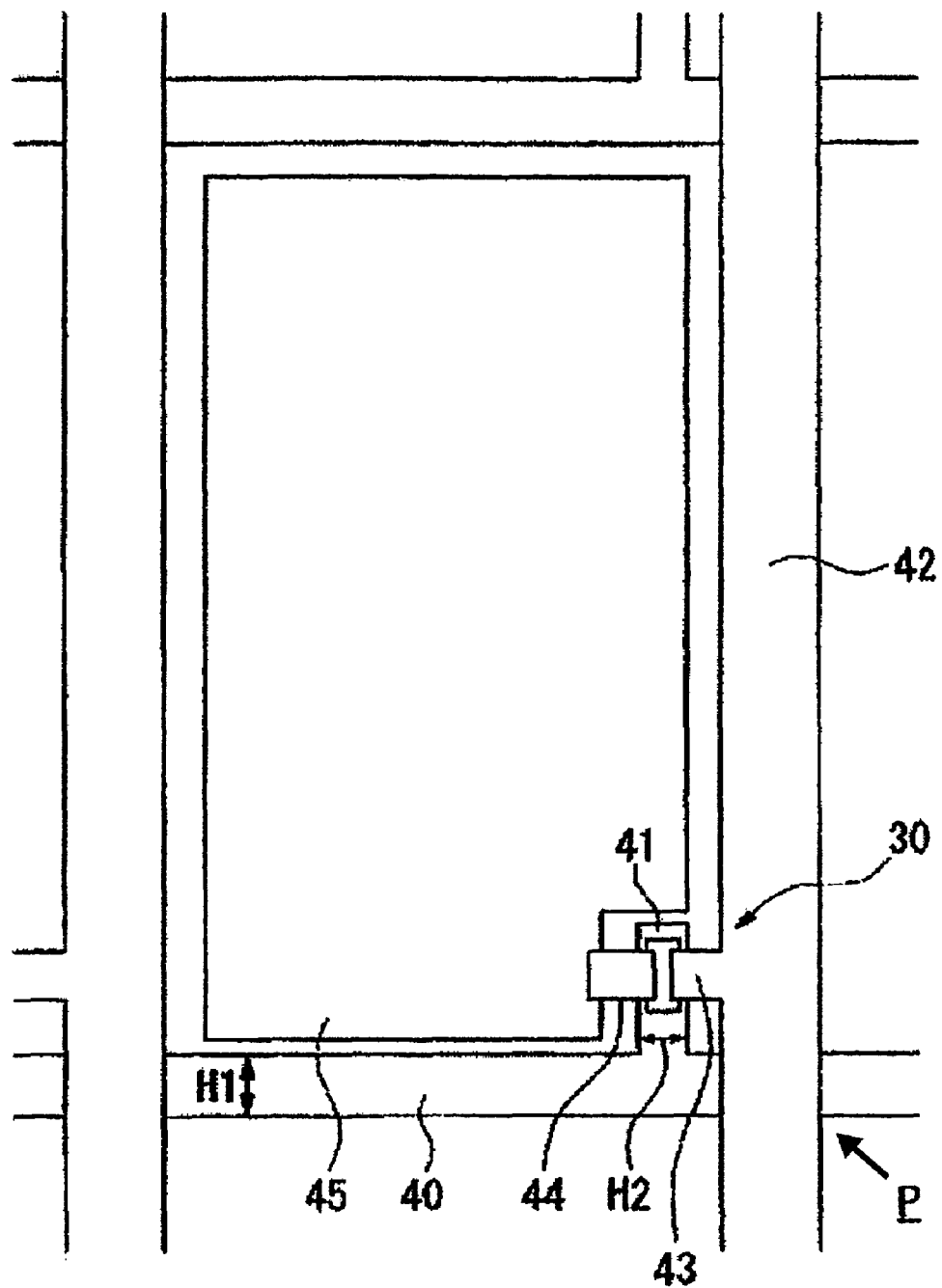
FIG. 1 is a plan view showing the configuration of a TFT array substrate formed by the wiring method of the first embodiment of the present invention.

Selected embodiments of the present invention will now be explained with reference to the drawings. It will be apparent to those skilled in the art from this disclosure that the following descriptions of the embodiments of the present invention are provided for illustration only and not for the purpose of limiting the invention as defined by the appended claims and their equivalents.

A method of forming a wiring in a thin-film transistor in accordance with the present invention includes steps of: providing a bank having a groove defined thereon, the groove having a wiring formation area and a secondary area that is contiguously connected with the wiring formation area; placing a liquid material in the wiring formation area by depositing droplets of the liquid material, the liquid material containing a structural material for the wiring; and placing the liquid material in the secondary area, a per unit amount of the liquid material placed in the secondary area being smaller than a per unit amount of the liquid material deposited in the wiring formation area.

According to the wiring method of the present invention, the liquid material in the wiring formation area is smaller in amount than the liquid material in the secondary area. Therefore, the thickness of the insulating film that is formed on the secondary area can be increased relatively as compared to the thickness of the insulating film formed on the wiring formation area. Thus, it is possible to reduce the occurrence of insufficient insulation on the secondary area. Therefore, when a wiring such as gate wiring is formed using the wiring method of the present invention, it is possible to reduce the occurrence of insufficient insulation even when the insulating film is made thinner.

According to the wiring method of the present invention, the wiring method can further include steps of: drying the liquid material in the wiring formation area; and drying the liquid material in the secondary area. A film of the liquid material in the wiring formation area is thicker than a film of the liquid material in the secondary area.

According to the wiring method of the present invention, the wiring formation area can be a gate wiring of the thin film transistor, and the secondary area can be a gate electrode of the thin film transistor.

According to the wiring method of the present invention that employs such configuration, since the gate electrode is made thinner than the gate wiring, it is possible to ensure sufficient thickness in the insulating film on the gate electrode. Therefore, it is possible to reduce the occurrence of insufficient insulation on the gate electrode.

According to the wiring method of the present invention, the secondary area can be an accumulation and storage capacity of the thin film transistor.

According to the wiring method of the present invention, the wiring formation area can also be an accumulation and storage capacity wiring of the thin film transistor.

According to the wiring method of the present invention that employs such configuration, since the accumulation and storage capacity is made thinner than the accumulation and storage capacity wiring, it is possible to ensure sufficient thickness in the insulating film over the accumulation and storage capacity. Therefore, it is possible to reduce the occurrence of insufficient insulation over the accumulation and storage capacity.

According to the wiring method of the present invention, in the placing of the liquid material in the secondary area, the liquid material can be placed in the secondary area by the liquid material deposited in the wiring formation area flowing into the secondary area due to the fluidity of the liquid material.

According to the wiring method of the present invention that employs such configuration, the liquid material flows into the secondary area due to its natural fluidity. Thus, the amount of the liquid material placed in the secondary area is less than the amount of the liquid material placed in the wiring formation area. Therefore, the wiring in the secondary area can be formed to be thin easily by subsequently drying or otherwise treating the liquid material.

According to the wiring method of the present invention, in the placing of the liquid material in the secondary area, the liquid material can be placed in the secondary area by depositing droplets of the liquid material that are smaller than the droplets of the liquid material deposited in the wiring formation area.

According to the wiring method of the present invention that employs such configuration, smaller droplets of the liquid material are deposited into the secondary area than in the wiring formation area. Therefore, the wiring in the secondary area can be easily formed to be thin by subsequently drying or otherwise treating the liquid material.

According to the wiring method of the present invention, the placing of the liquid material in the secondary area can be performed after the drying of the liquid material in the wiring formation area. In the placing of the liquid material in the secondary area, the liquid material can be placed in the secondary area by depositing droplets of the liquid material that are smaller than the droplets of the liquid material deposited in the wiring formation area.

According to the wiring method of the present invention that employs such configuration, smaller droplets of the liquid material are deposited into the secondary area after the droplets deposited into the wiring formation area are dried. When the liquid material is simultaneously deposited into the wiring formation area and the secondary area, there is a possibility that the amount of the liquid material deposited in both areas will be made uniform due to leveling. Therefore, it is preferable, for example, to first deposit the liquid material into the wiring formation area, dry the liquid material, and then deposit the liquid material into the secondary area.

The wiring method of the present invention can further include the step of placing an insulating film over the wiring formation area and the secondary area, a thickness of the insulating film over the wiring formation area being smaller than the thickness of the insulating film over the secondary area.

Embodiments of the wiring method relating to the present invention will now be described with reference to the diagrams. In the following diagrams, the scale of the members and layers has been appropriately modified so that the components and layers can be easily recognized.

First Embodiment

The wiring method of the present embodiment is used, for example, to manufacture a thin-film transistor (TFT) as shown in FIG. 1, which is used as a switching element. FIG. 1 is a plan view showing the schematic configuration of a TFT array substrate P.

As shown in FIG. 1, gate wiring 40, source wiring 42, a drain electrode 44, and a pixel electrode 45 electrically connected to the drain electrode 44 are disposed on the TFT array substrate P having a TFT 30. The gate wiring 40 is formed so as to extend in the direction of the X-axis as viewed in FIG. 1, and one part 41 thereof is formed so as to extend in the direction of the Y-axis. The gate wiring 40 has portions that extend in the direction of the Y-axis and are used as gate electrodes 41. The width H2 of the gate electrode 41 is less than the width H1 of the gate wiring 40 in this embodiment. This gate wiring 40 is then formed by the wiring method of the present embodiment. Also, the source wiring 42 has a portion that extends in the direction of the Y-axis and is used as a source electrode 43.

Wiring Method

A method for manufacturing the TFT array substrate P using the wiring method of the present embodiment will now be described with reference to FIGS. 2 and 3.

First Bank Formation Step

First, as shown in FIG. 2(a), a first bank B is formed by photolithography on the top surface of a cleaned glass substrate 610, to allow a groove Ba having the size of 1/20 to 1/10 the size of one pixel pitch to be formed on the first bank B. Since photolithography is well known in the art, detailed explanation thereof will be omitted herein. This bank B must be optically transparent and liquid-repellent when formed. Suitable examples of the material for the bank B include acrylic resins, polyimide resins, olefin resins, melamine resins, and other such polymeric materials.

In order to make the bank B liquid-repellent after it is formed, $CF_4$ plasma treatment (a plasma treatment using a gas with a fluorine component) or the like must be applied. Instead of the plasma treatment, liquid-repellent components (fluorine groups or the like) may instead be filled into the material of the bank B itself in advance. In this case, a separate treatment such as the $CF_4$ plasma treatment or the like that renders liquid repellency can be dispensed with.

The angle of contact of the ejected ink on the bank B that has been made liquid-repellent as described above is preferably kept at 40° or greater, and the angle of contact on the glass surface is preferably kept at 10° or less. Specifically, the inventors have confirmed as a result of experimentation that, when an acrylic resin was employed as the material for the bank B, the angle of contact of electrically conductive microparticles (tetradecane solvent), for example, was able to be kept at about 54.0° when the bank B was rendered liquid repellent, while such contact angle is 10° or less when the bank B was not rendered liquid repellent. This angle of contact in the case the bank B was rendered liquid repellent was obtained when plasma treatment was performed under conditions of supplying methane tetrafluoride gas at a rate of 0.1 L/min with 550 W of plasma power.

Gate Wiring Step

In the gate wiring step, which follows the first bank formation step, droplets containing a gate wiring material are ejected according to a droplet ejection method to form the gate wiring 40 (gate electrode 41) so as to fill in the groove Ba. The groove Ba is a drawing area defined by the bank B. The wiring method of the present embodiment is applied when the gate wiring 40 is formed.

Specifically, first, as shown in FIG. 3(a), droplets of a functional liquid L (liquid material) containing the gate wiring material are deposited by a droplet ejection method onto specific locations along a gate wiring formation area Ba1 (an example of the wiring formation area) that extends in the direction of the X-axis. When the droplets of the functional liquid L are deposited onto the gate wiring formation area Ba1, the droplets are ejected onto the gate wiring formation area Ba1 from above the gate wiring formation area Ba1 using a droplet ejection method. In the present embodiment, as shown in FIG. 3(a), droplets of the functional liquid L are deposited at specific intervals along the direction in which the gate wiring formation area Ba1 extends (the X-axis direction). At this time, the droplets of the functional liquid L are also deposited in the vicinity of a connecting area 37 (intersecting area) where the gate wiring formation area Ba1 and a gate electrode formation area Ba2 (an example of the secondary area) are contiguously connected to one another.

As shown in FIG. 3(b), the functional liquid L deposited in the gate wiring formation area Ba1 expands within the gate wiring formation area Ba1 due to the natural fluidity of the functional liquid L. Furthermore, the functional liquid L deposited on the gate wiring formation area Ba1 also expands in the gate electrode formation area Ba2 due to the natural fluidity. The functional liquid L is thereby also deposited in the gate electrode formation area Ba2 without droplets being ejected directly onto the gate electrode formation area Ba2 from above the gate electrode formation area Ba2.

Thus, by being deposited on the gate wiring formation area Ba1, the functional liquid L can also be disposed on the gate electrode formation area Ba2 due to the natural fluidity (capillary phenomenon) of the functional liquid L that is deposited on the gate wiring formation area Ba1.

The amount of the functional liquid L that is deposited on the gate electrode formation area Ba2 through the flow from the gate wiring formation area Ba1 as a result of the natural fluidity is less than the amount of the functional liquid L deposited on the gate wiring formation area Ba1. Therefore, the thickness of the liquid film formed on the gate electrode formation area Ba2 is less than the thickness of the liquid film formed on the gate wiring formation area Ba1.

Examples of materials that can be employed as the gate wiring material (structural material) contained in the functional liquid L include Ag, Al, Au, Cu, palladium, Ni, W—si, electrically conductive polymers, and the like. Also, since the bank B is sufficiently liquid-repellent, the functional liquid L can be deposited being spilled from the groove Ba.

After the functional liquid L is deposited onto the glass substrate 610, an intermediate drying treatment is performed as necessary to remove the dispersion solvent and to ensure film thickness. The drying treatment can be performed, for example, by using a regular hot plate, electric furnace, or other device to heat the glass substrate 610, or by lamp annealing.

The light source used in lamp annealing is not particularly limited. Possible examples of suitable light sources include an infrared lamp, a xenon lamp, a YAG (yttrium aluminum garnet) laser, an argon laser, a carbonate gas laser, or an excimer laser that uses XeF, XeCl, XeBr, KrF, KrCl, ArF, ArCl, or the like. These light sources commonly have an output of equal to or greater than 10 W to equal to or lower than 5000 W. For the present embodiment, the light sources of 100 W to 1000 W suffice.

The intermediately dried film must have the dispersion solvent completely removed in order to ensure a good electrical connection between microparticles. Also, when the surface of the conductive microparticles is coated with an organic or other such coating material to improve dispersion, such coating material must also be removed. Therefore, the glass substrate 610 is subjected to a heat and/or light treatment after the ejection step.

The heat treatment and the light treatment are commonly performed in the atmosphere, but can also be performed in the presence of inert gas such as nitrogen, argon, and helium, as necessary. The temperature of the heat treatment and/or light treatment is appropriately determined in view of the boiling point of the dispersion solvent (vapor pressure), the type and the pressure of the atmospheric gas, the thermal behavior of the microparticles, such as the dispersibility and the propensity toward oxidation, the presence or absence and the quantity of the coating material, the upper limit of the heat resistance of the substrate, and the like.

For example, in order to remove a coating material composed of organic matter, the substrate must be baked at about 300° C. In this case, for example, the top of the bank B and the dried film of the functional liquid L may be coated in advance with a low-melting point glass.

Also, when the substrate is made of a plastic or other such material, the temperature of the heating treatment is preferably between the room temperature and about equal to or lower than 100° C.

Figure 2:
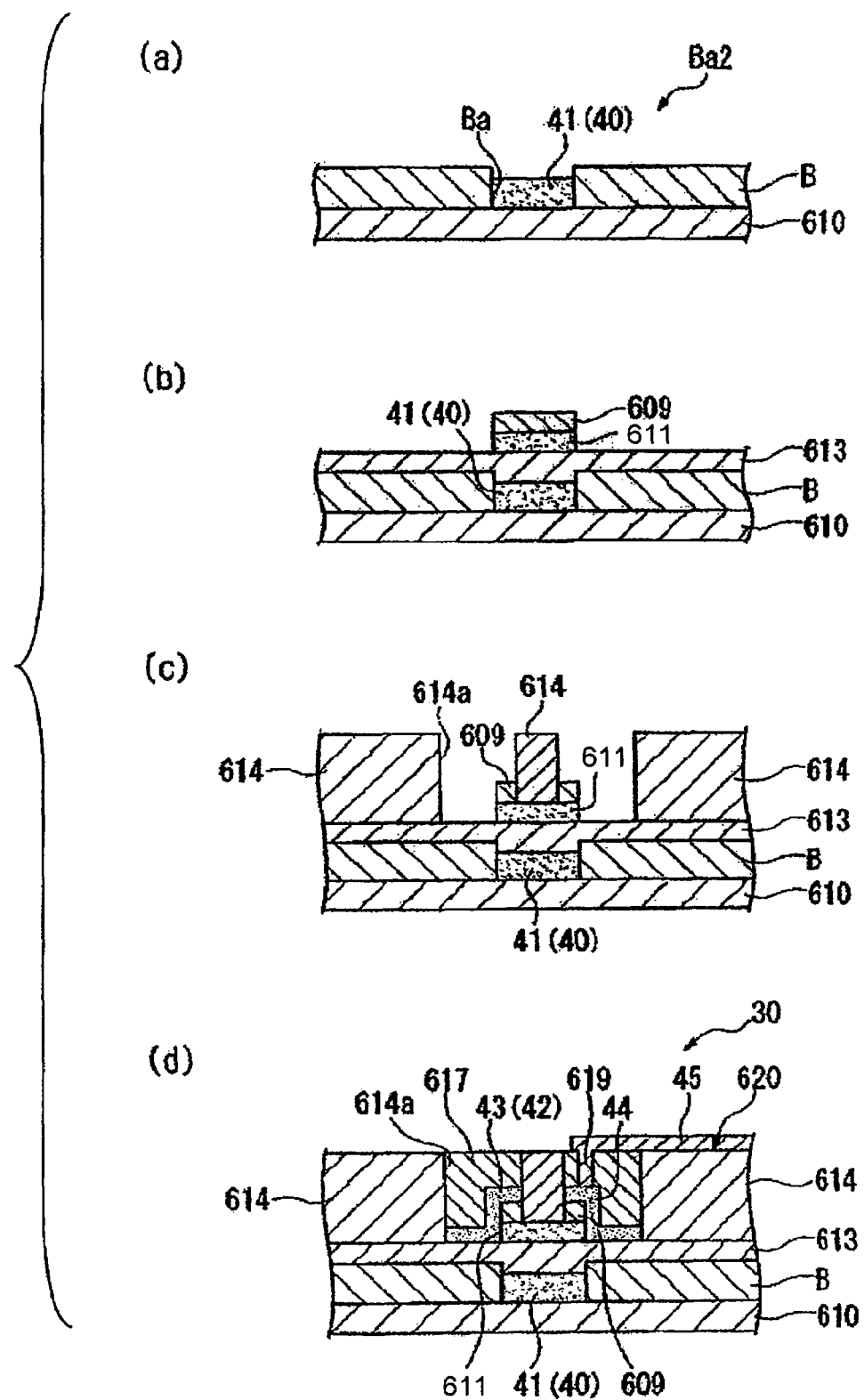
FIGS. 2(*a*)-(*d*) are diagrams for showing the wiring method of the first embodiment of the present invention.
Figure 3:
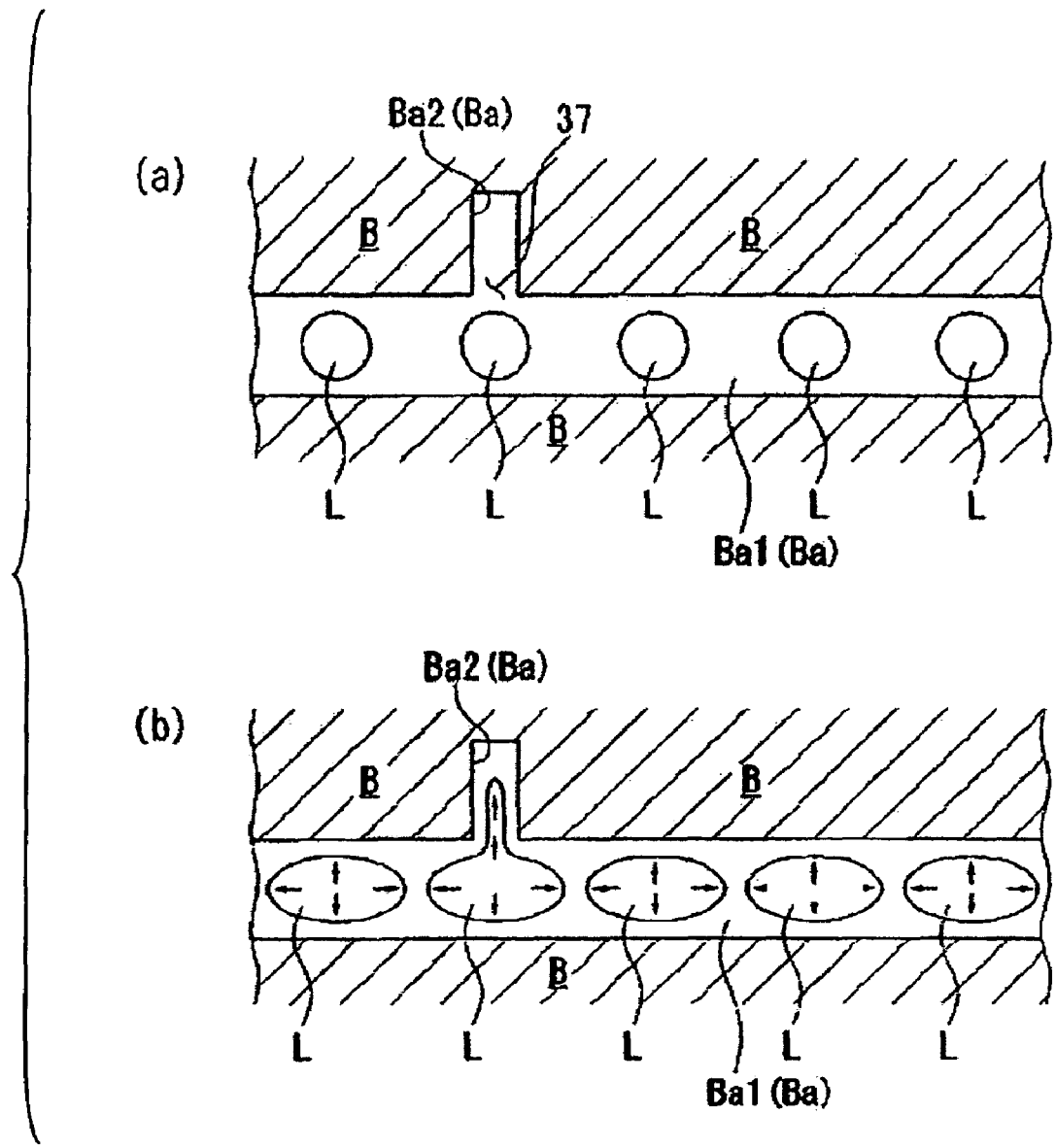
FIGS. 3(*a*)-(*b*) are diagrams for showing the wiring method of the first embodiment of the present invention.

In this manner, the dried film after the ejection maintains electrical connection between the microparticles, and is converted to the gate wiring 40 (gate electrode 41) as shown in FIG. 2(*a*).

The gate electrode 41 that is part of the gate wiring 40 thus formed has a thickness that is thinner than that of the rest of the gate wiring 40. More specifically, the per unit area amount of the functional liquid L deposited on the gate electrode formation area Ba2 by flow of the function liquid L into the gate electrode formation area Ba2 due the natural fluidity as described above is smaller than the per unit area amount of the functional liquid L deposited on the gate wiring formation area Ba1. Accordingly, the thickness of the gate electrode 41 obtained by subjecting the functional liquid L to the intermediate drying treatment and the heating treatment and/or the light treatment is smaller than the thickness of the rest of the gate wiring 40. Therefore, according to the wiring method of the present embodiment, the top surface of the gate electrode 41 is positioned lower than the top surface of the gate wiring 40. Particularly, if the top surface of the gate wiring 40 is formed to be at the same level as the top surface of the bank B, the top surface of the gate electrode 41 is formed to be lower than the top surface of the bank B, as shown in FIG. 2(*a*).

Semiconductor Layer Formation Step

Next, as shown in FIG. 2(*b*), a gate insulating film 613 (insulating film), an active layer 611, and a contact layer 609 are formed continuously using the plasma CVD method. A silicon nitride film is used to form the gate insulating film 613, an amorphous silicon film is used to form the active layer 611, and an $n^+$-type silicon film is used to form the contact layer 609 by varying the raw material gas and plasma conditions. When these films are formed by CVD, a heat history of 300° C. to 350° C. is required. Although heat history of such low temperature generally tends to cause transparency problems and heat-resistance problems, it is possible to avoid such problems by including silicon as a primary component in the principal chains of the basic framework of these films, while using a silica glass-based material having a structure of hydrogen carbide or the like in the side chains.

The gate electrode 41 herein is formed to be thinner than the other part of the gate wiring 40 as described above. As a result, a thicker insulating film 613 is formed on the gate electrode 41 than on the rest of the gate wiring 40, as shown in FIG. 2(*b*).

Second Bank Formation Step

In the second bank formation step, which follows the semiconductor layer formation step described above, the contact layer 609 is etched in advance to secure a channel. Furthermore, as shown in FIG. 2(*c*), a second bank 614 for providing a groove 614*a* having the size of 1/20 to 1/10 the size of one pixel pitch is formed by photolithography on the top surface of the gate insulating film 613. This second bank 614 must be optically transparent and liquid-repellent when formed. Suitable examples for the material of the second bank 614 include acrylic resins, polyimide resins, olefin resins, melamine resins, and other such polymeric materials.

In order to make the second bank 614 liquid-repellent, $CF_4$ plasma treatment (a plasma treatment using a gas with a fluorine component) or the like must be applied. Instead of the plasma treatment, liquid-repellent components (fluorine groups or the like) may instead be filled into the material of the second bank 614 itself in advance. In this case, a separate treatment such as the $CF_4$ plasma treatment or the like that renders liquid repellency can be dispensed with.

The angle of contact of the ejected ink on the second bank 614 that has been rendered liquid-repellent as described above should be preferably kept at 40° or greater.

Source Wiring Step

In the source wiring step, which follows the second bank formation step, droplets containing a source wiring material are ejected by a droplet ejection method so as to fill in the groove 614*a*, which is a drawing area defined by the second bank 614. Then, an intermediate drying treatment and a heat treatment and/or a light treatment are applied to form a source wiring 42 that intersects with the gate wiring 40, as shown in FIG. 2(*d*).

Examples of suitable electrically conductive materials from which the source wiring 42 is to be formed include Ag, Al, Au, Cu, palladium, Ni, W—si, conductive polymers, and the like. It is possible to use the resulting source electrode 43 and the drain electrode 44 to form a precise wiring pattern without the materials spilling out of the second bank 614*a*, because the second bank 614 is made sufficiently liquid-repellent in advance.

Also, insulating material 617 is deposited so as to fill in the groove 614*a* in which the source electrode 43 and the drain electrode 44 are disposed. As a result of the steps described above, a flat top surface 620 including the top surface of the bank 614 and the top surface of the insulating material 617 is formed over the substrate 610.

Thereafter, a contact hole 619 is formed in the insulating material 617, a patterned pixel electrode (made of Indium Tin Oxide or ITO) 618 is formed on the top surface 620, and the drain electrode 44 and the pixel electrode 618 are connected via the contact hole 619. In this manner, the TFT array substrate P on which a TFT is formed is manufactured.

Thus, in the TFT array substrate P having a gate wiring 40 that is formed using the wiring method of the first embodiment, the gate electrode 41 is formed to be thinner than the rest of the gate wiring 40. Therefore, the thickness of the gate insulating film 613 on the gate electrode 41 is greater than the thickness of the insulating film 613 disposed on the rest of the gate wiring 40. It is therefore possible to reduce the occurrence of insufficient insulation between the source electrode 43 or drain electrode 44 and the gate electrode 41, even when the insulating film is made thinner in order to improve the productivity of the TFT array substrate P.

Also, according to the wiring method of the first embodiment, the liquid film that forms on the gate electrode formation area Ba2 can easily be made thinner than the liquid film disposed on the gate wiring formation area Ba1 by allowing the liquid film to flow naturally into the gate electrode formation area Ba2 due to its natural fluidity. Therefore, a thinner gate electrode 41 can be easily formed by subjecting the functional liquid L to an intermediate drying treatment as well as a heating treatment and/or a light treatment.

Possible examples of the ejection technique for the droplet ejection method include a charge control system, a pressurized vibration system, an electromechanical conversion system, a thermoelectric conversion system, an electrostatic attraction system, and the like. The charge control system involves applying an electric charge to a material with an electric charge electrode and ejecting the material from nozzles while controlling the spraying direction of the material with a deflecting electrode. In the pressurized vibration system, an extremely high pressure of about 30 $kg/cm^2$ is applied to the material to be ejected from the distal ends of the nozzles, wherein the material is ejected from the nozzles in a rectilinear fashion when the controlled voltage is not applied to the material, while the material is scattered but not ejected from the nozzles due an electrostatic repulsion between particles of the material when the controlled voltage is applied to the material. Also, the electromechanical conversion system utilizes a piezoelement (piezoelectric element) that has the property of deforming upon receiving a pulsed electrical signal. The material is ejected when the deformation of the piezoelectric element applies pressure via a flexible substance to the space in which the material is contained and the material is pushed out of the space.

In the thermoelectric conversion system, the material is rapidly gasified to create bubbles by a heater provided in the space where the material is contained, and the material in the space is ejected due to the pressure from the bubbles. In the electrostatic attraction system, a small amount of pressure is applied to the space where the material is contained, a meniscus of the material is formed in the nozzles, and in this state the electrostatic attraction is applied to draw out the material. Other techniques can also be applied, including a system of utilizing changes in the viscosity of the fluid by way of an electric field, a system of spraying by discharge sparks, and the like. Droplet ejection methods have advantages in that there is relatively less amount of material that is wasted during use, and a desired amount of material can be accurately deposited at a desired location. The mass of one droplet of liquid material (fluid) ejected by droplet ejection methods is 1 to 300 nanograms, for example.

Droplet Ejection Apparatus

Figure 4:
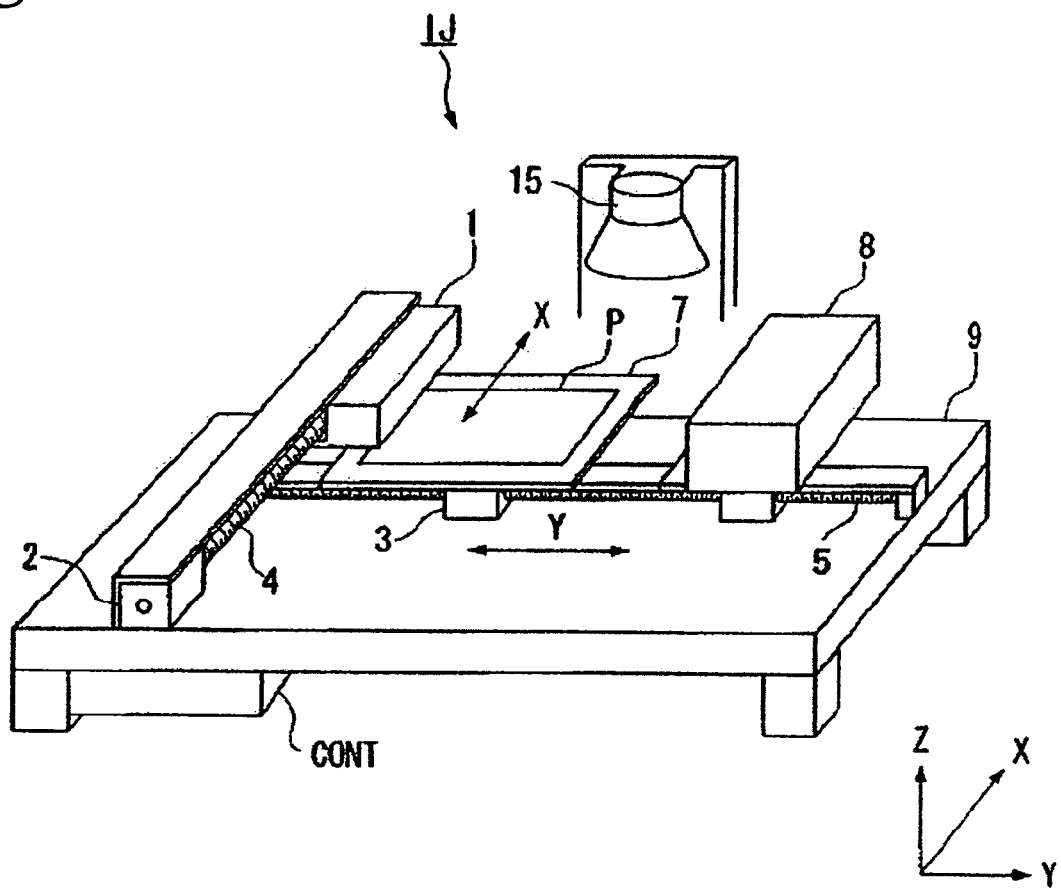
FIG. 4 is a perspective view showing the configuration of a droplet ejection apparatus which is used in performing the wiring method of the first embodiment of the present invention.

FIG. 4 is a perspective view showing the schematic configuration of a droplet ejection apparatus (inkjet apparatus) IJ that employs an electromechanical conversion system, which is one example of the apparatus used to perform the wiring method of the present invention.

The droplet ejection apparatus IJ includes a droplet ejection head 1, an X-axis drive shaft 4, a Y-axis guide shaft 5, a control apparatus CONT, a stage 7, a cleaning mechanism 8, a stand 9, and a heater 15.

The stage 7 supports a substrate P onto which ink (liquid material) is to be ejected by the droplet ejection apparatus IJ, and includes a fixing mechanism (not shown) for fixedly supporting the substrate P in a designated position.

The droplet ejection head 1 is a multi-nozzle droplet ejection head with a plurality of ejection nozzles. The longitudinal direction of the droplet ejection head 1 coincides with the Y-axis direction. The plurality of ejection nozzles are provided at a constant interval along the Y-axis direction on the bottom surface of the droplet ejection head 1. Ink containing the electrically conductive microparticles described above is ejected from the ejection nozzles of the droplet ejection head 1 onto the substrate P supported on the stage 7.

An X-axis drive motor 2 is connected to the X-axis drive shaft 4. The X-axis drive motor 2 is a stepping motor or the like that is configured to rotate the X-axis drive shaft 4 when an X-axis direction drive signal is supplied from the control apparatus CONT. When the X-axis drive shaft 4 rotates, the droplet ejection head 1 moves in the direction of the X-axis.

The Y-axis guide shaft 5 is immovably fixed on the stand 9. The stage 7 further includes a Y-axis drive motor 3. The Y-axis drive motor 3 is a stepping motor or the like that is configured to move the stage 7 in the direction of the Y-axis when a Y-axis direction drive signal is supplied from the control apparatus CONT.

The control apparatus CONT is configured to supply a voltage for controlling the ejection of the droplet ejection head 1. The control apparatus CONT is also configured to supply to the X-axis drive motor 2 a drive pulse signal for controlling the movement of the droplet ejection head 1 in the X-axis direction, and to the Y-axis drive motor 3 a drive pulse signal for controlling the movement of the stage 7 in the Y-axis direction.

The cleaning mechanism 8 cleans the droplet ejection head 1. The cleaning mechanism 8 includes a cleaning drive motor that drives in the Y-axis direction (not shown). The cleaning mechanism 8 moves along the Y-axis guide shaft 5 due to the driving of the cleaning drive motor in the Y-axis direction. The movement of the cleaning mechanism 8 is also controlled by the control apparatus CONT.

The heater 15 is a device for performing the heat treatment of the substrate P by lamp annealing, such that the solvent contained in the liquid material applied onto the substrate P evaporates and dries. The power source of the heater 15 is also switched on and off in a controlled manner by the control apparatus CONT.

The droplet ejection apparatus IJ ejects droplets onto the substrate P while the droplet ejection head 1 and the stage 7 supporting the substrate P are moved or scanned relative to each other. In the following descriptions, the X-axis direction is the scanning direction, and the Y-axis direction which is orthogonal to the X-axis direction is the non-scanning direction. Therefore, the ejection nozzles of the droplet ejection head 1 are aligned at a predetermined interval in the Y-axis direction, which is the non-scanning direction. In FIG. 4, the droplet ejection head 1 is disposed at a right angle relative to the direction in which the substrate P advances. However, the angle of the droplet ejection head 1 may be adjusted to an angle that intersects with the advancement direction of the substrate P. In this manner, the pitch between the ejection nozzles can be adjusted by adjusting the angle of the droplet ejection head 1. Also, the distance between the substrate P and the nozzle surface can be adjusted to a desired distance.

Figure 5:
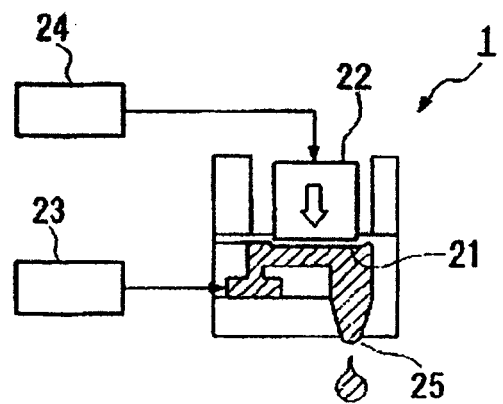
FIG. 5 is a schematic diagram showing the piezo system of the droplet ejection apparatus shown in FIG. 4 ejecting a droplet of liquid material.

FIG. 5 is a diagram showing the principles of ejecting the liquid material with a piezo system.

In FIG. 5, a piezoelement 22 is disposed adjacent to a liquid chamber 21 for storing liquid material (in other words functional liquid, for example an ink for a wiring pattern). The liquid chamber 21 is supplied with liquid material through a liquid material supply system 23 that includes a material tank for storing liquid material.

The piezoelement 22 is connected to a drive circuit 24. When a voltage is applied to the piezoelement 22 via the drive circuit 24 to deform the piezoelement 22, the liquid chamber 21 also deforms, and the liquid material is ejected from the nozzle 25. In this case, the amount of deformation of the piezoelement 22 is controlled by varying the level of the voltage to be applied. Also, the speed of deformation of the piezoelement 22 is controlled by varying the frequency at which the voltage is applied.

The piezo system has advantages over other systems in that since droplet ejection does not heat the material, the composition of the material is less likely to be affected.

Liquid Crystal Display Apparatus

Figure 6:
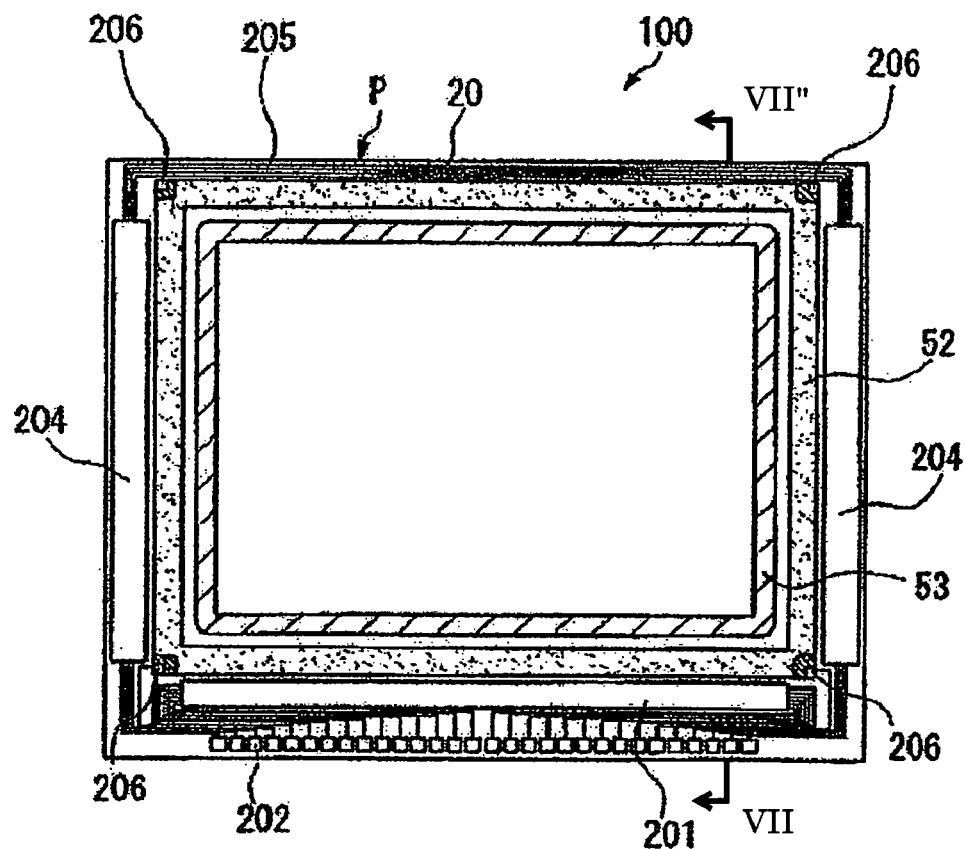
FIG. 6 is a plan view of a liquid crystal display apparatus having a TFT array substrate P shown in FIG. 1.
Figure 7:
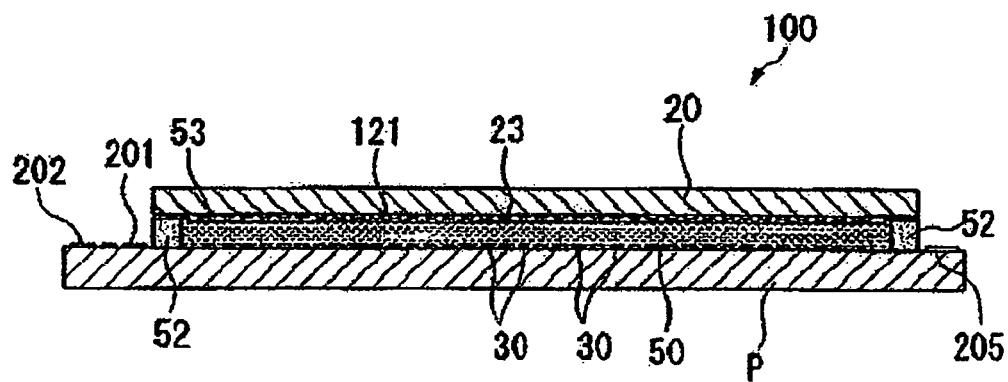
FIG. 7 is a cross-sectional view of the liquid crystal display apparatus viewed along the line VII-VII" shown in FIG. 6.
Figure 8:
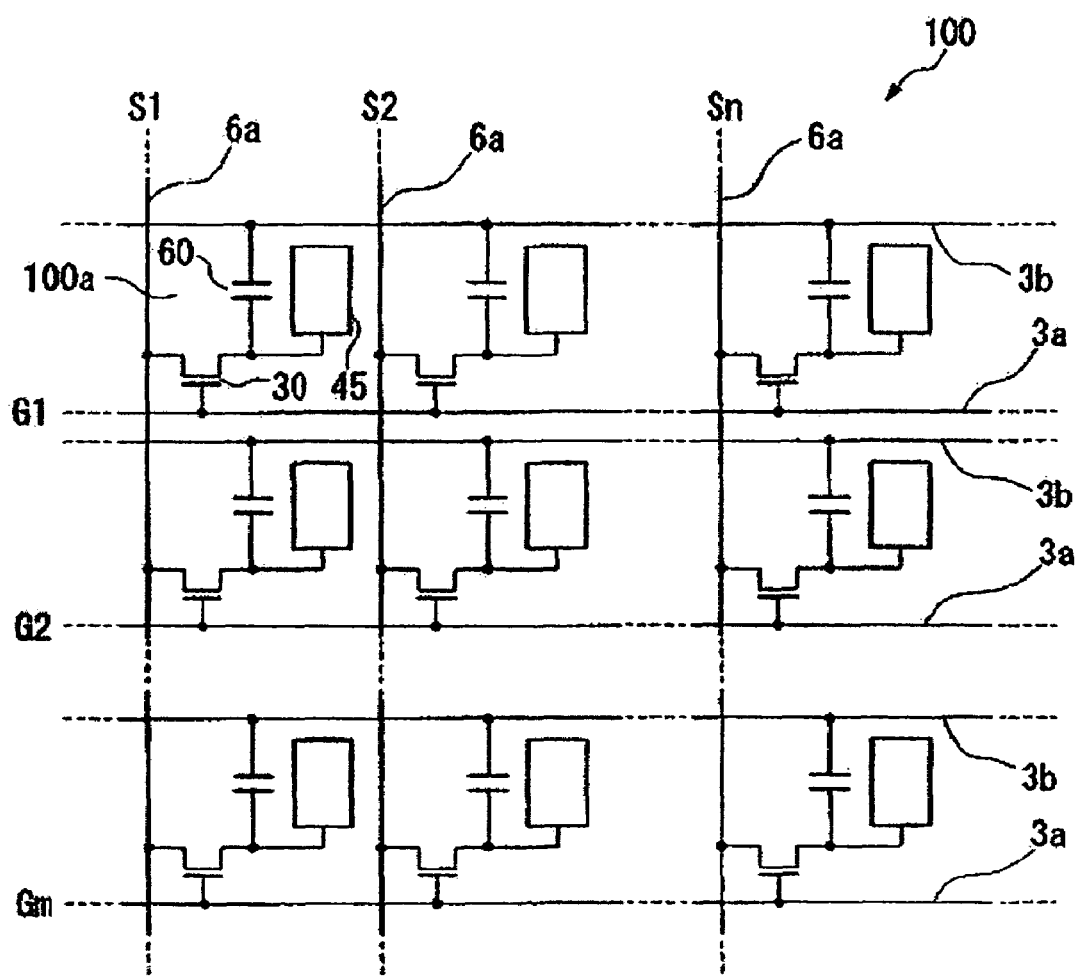
FIG. 8 is an equivalent circuit diagram of the liquid crystal display apparatus shown in FIG. 6.

FIG. 6 is a plan view of a liquid crystal display apparatus (electrooptical apparatus) 100 having a TFT array substrate P manufactured using the wiring method described above, shown together with other structural elements and seen from the side of an opposing substrate. FIG. 7 is a cross-sectional view of the liquid crystal display apparatus 100 viewed along the line VII-VII' in FIG. 6. FIG. 8 is a diagram of equivalent circuits of various elements and wirings in the image display section of the liquid crystal display apparatus 100, where the plurality of pixels is formed in a matrix configuration.

In FIGS. 6 and 7, the liquid crystal display apparatus (electrooptical apparatus) 100 of the present embodiment has a TFT array substrate P and an opposing substrate 20 that constitute a pair and are laminated by a sealing member 52, which is a photocuring sealant. Liquid crystal 50 is sealed and retained in the section partitioned off by the sealing member 52. The sealing member 52 is formed in the shape of a frame within the substrate surface that is devoid of a liquid crystal inlet, and shows no traces of being sealed with a sealant.

A peripheral break line 53 composed of light-blocking material is formed within the area in which the sealing member 52 is formed. A data wire drive circuit 201 and mounting terminals 202 are formed along one side of the TFT array substrate P outside the area in which the sealing member 52 is formed. Scanning wire drive circuits 204 are formed along two sides (right and left sides in FIG. 6) that are adjacent to the side along which the data wire drive circuit 201 is formed. The remaining side of the TFT array substrate P is provided with a plurality of wires 205 that connect the scanning wire drive circuits 204 on both sides of the image display section. Also, at least one inter-substrate conductive member 206 (two in FIG. 6) is provided at the corner of the opposing substrate 20 to establish electrical conductivity between the TFT array substrate P and the opposing substrate 20.

Instead of forming the data wire drive circuit 201 and the scanning wire drive circuits 204 on the TFT array substrate P, for example, a TAB (Tape Automated Bonding) substrate may be electrically or mechanically connected via an anisotropic conductive film to a group of terminals formed on the periphery of the TFT array substrate P. A drive LSI is mounted on such TAB.

Although a phase plate, a polarizing plate, or the like are disposed in a predetermined orientation in the liquid crystal display apparatus 100 based on the type of liquid crystal 50 used, in other words whether the liquid crystal 50 is operating in the TN (Twisted Nematic) mode, the C-TN (Compensated Twisted Nematic) mode, the VA (Vertically Aligned) mode, the IPS (In-Plane Switching) mode or the like, or whether the liquid crystal 50 is operating in the normally white mode/normally black mode. However, illustration of the phase plate and the polarizing plate is omitted herein.

Also, when the liquid crystal display apparatus 100 is configured for use as a color display, for example, red (R), green (G), and blue (B) color filters along with the protective film may be formed in portions of the opposing substrate 20 that face the respective pixel electrodes of the TFT array substrate P which will be described below.

In the image display section of the liquid crystal display apparatus 100 having such structure, the plurality of pixels 100a is configured as a matrix as shown in FIG. 8. A TFT (switching element) 30 for pixel switching is formed in each pixel 100a. Data wires 6a for supplying pixel signals S1, S2, . . . , Sn are electrically connected to the source of each TFT 30 as well as a capacitor 60. The pixel signals S1, S2, . . . , Sn that are written into the data wires 6a may be fed sequentially to the wires in this order as a one pass scan, or may be fed as a group of a plurality of adjacent data wires 6a. Also, the scanning wires 3a are electrically connected to the gate of each TFT 30, and are configured so that scanning signals G1, G2, . . . , Gm are applied to the scanning wires 3a as a one pass scan in the manner of pulses at a predetermined timing.

A pixel electrode 45 is electrically connected to the drain electrode of each TFT 30. The pixel signals S1, S2, . . . , Sn that are fed from the data wires 6a are written into respective pixels at a specific timing by turning the TFTs 30 (the switching elements) on for a specific amount of time. The pixel signals S1, S2, . . . , Sn having a specific level thus written into the liquid crystal 50 via a pixel electrode 19 are maintained for a specified time period between the TFTs 30 and an opposing electrode 121 of the opposing substrate 20 as shown in FIG. 7.

EL Display Device

In the embodiment described above, the TFTs 30 are used as switching elements for driving the liquid crystal display apparatus 100. TFTs can be applied to an organic EL (electro-luminescence) display device, for example, in addition to a liquid crystal display apparatus. An organic EL display device is an element wherein a thin film containing fluorescent inorganic and organic compounds are contained between a negative electrode and a positive electrode, such that excitons are produced by excitation that is caused by injection of electrons and holes into the thin film. Light is produced by utilizing the emission of light (fluorescent light/phosphorescent light) that occurs when the excitons recombine. A light-emitting full color EL device can be manufactured by treating as an ink the materials for forming light-emitting layers and hole injection/electron transfer layers, in other words the fluorescent materials for emitting red, green, and blue lights, and patterning the materials on the TFT array substrate P. An electrooptical device in accordance with the present invention includes such organic EL device.

Figure 9:
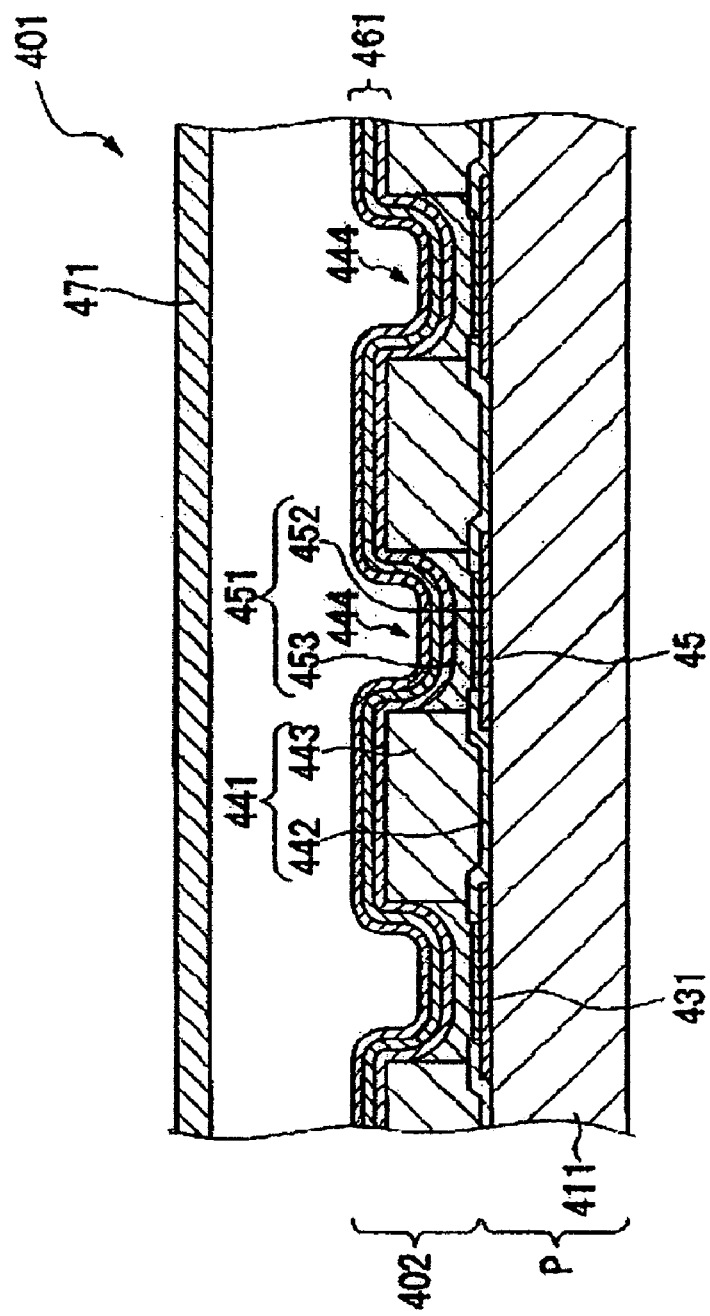
FIG. 9 is a cross-sectional side view of an organic EL display apparatus having a TFT array substrate shown in FIG. 1.

FIG. 9 is a cross-sectional side view of an organic EL apparatus that has a TFT array substrate P manufactured using the wiring method described above. The schematic configuration of the organic EL apparatus will now be described with reference to FIG. 9.

The organic EL apparatus 401 shown in FIG. 9 is connected to wirings and a drive IC (not shown) of a flexible substrate (not shown). The organic EL apparatus 401 includes an organic EL element 402, a TFT array substrate P, and a closing substrate 471. The organic EL element 402 includes bank sections 441, light emitting elements 451, and a cathode 461 (opposing electrode). The TFT array substrate P includes a substrate 411 and circuit element sections 431. In the circuit element section 431, a TFT as an active element is formed on the substrate 411. A plurality of pixel electrodes 45 are aligned on the circuit element section 431.

The bank sections 441 are formed in a lattice configuration in between the pixel electrodes 45, and the light emitting elements 451 are formed in concave openings 444 defined by the bank sections 441. The light emitting elements 451 include an element for emitting red light, an element for emitting green light, and an element for emitting blue light, such that a full color display can be achieved with the organic EL apparatus 401. The cathodes 461 are formed over the entire top surfaces of the bank sections 441 and the light emitting elements 451. The closing substrate 471 is layered over the cathodes 461.

Manufacturing Process

The process of manufacturing an organic EL apparatus 401 that has an organic EL element 402 includes a bank section formation step for forming the bank sections 441, a plasma treatment step for appropriately forming the light emitting elements 451, a light-emitting element formation step for forming the light emitting elements 451, an opposing electrode formation step for forming the cathodes 461, and a closing step for layering the closing substrate 471 over the negative electrodes 461.

The light-emitting element formation step is used to form the light emitting elements 451 by forming hole injection layers 452 and light-emitting layers 453 on the concave openings 444, specifically over the pixel electrodes 45. The light-emitting element formation step includes a hole injection layer formation step and a light-emitting layer formation step. The hole injection layer formation step has a first ejection step for ejecting a liquid material for forming the hole injection layer 452 onto the pixel electrodes 45, and a first drying step for drying the ejected liquid material to form the hole injection layer 452.

Also, the light-emitting layer formation step has a second ejection step for ejecting a liquid material for forming the light-emitting layer 453 onto the hole injection layer 452, and a second drying step for drying the ejected liquid material to form the light-emitting layer 453. The light-emitting layers 453 include three types of layers that are made from materials corresponding to the three colors of red, green, and blue as described above. Accordingly, the second ejection step includes three steps for ejecting the three respective materials.

In the light-emitting element formation step, the droplet ejection apparatus IJ previously described can be used to perform the first ejection step in the hole injection layer formation step, and the second ejection step in the light-emitting layer formation step.

Furthermore, in addition to the example of the electrooptical apparatus described above, other devices such as a PDP (plasma display panel) or a surface-conductive electron emission element can also be an electrooptical apparatus in accordance with the present invention. The surface conductive electron emission element utilizes the phenomenon of electron emission that occurs when an electric current runs parallel to the surface of a small-area thin film formed on a substrate.

In the present embodiment, the meaning of the term "electrooptical apparatus" includes those that possess the electrooptical effects of varying the refractive index of a substance and the transmittance of light therein with an electric field, as well as those that convert electrical energy to optical energy.

Next, specific examples of electronic devices having the electrooptical apparatus described above will be described with reference to FIG. 10.

Figure 10:
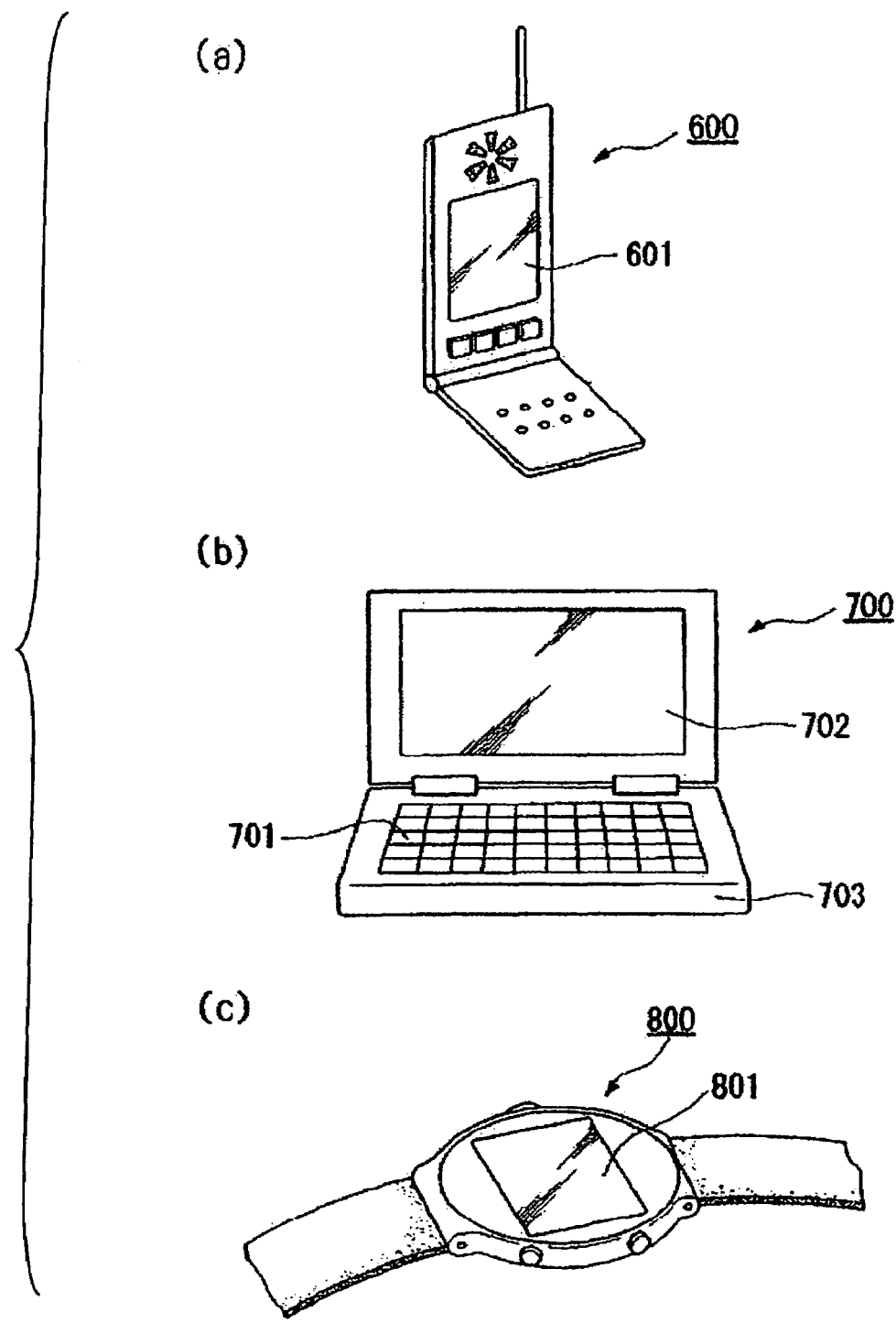
FIGS. 10(*a*)-(*c*) are diagrams showing examples of an electronic device having an electrooptical apparatus that has a TFT array substrate shown in FIG. 1.

FIG. 10(*a*) is a perspective view showing an example of a portable phone. In FIG. 10(*a*), a portable phone 600 includes a liquid crystal display section 601, which includes the liquid crystal display apparatus in accordance with the embodiment described above.

FIG. 10(*b*) is a perspective view showing an example of a word processor, personal computer, or other such portable information processing apparatus. In FIG. 10(*b*), an information processing apparatus 700 includes an information processing main body 703 an input unit 701 such as a keyboard on the information processing main body 703, and a liquid crystal display unit 702 having the liquid crystal display apparatus in accordance with the embodiment described above.

FIG. 10(*c*) is a perspective view showing an example of a wristwatch-type electronic device. In FIG. 10(*c*), a timepiece 800 has a liquid crystal display unit 801 comprising the liquid crystal display apparatus in accordance with the embodiment described above.

The electronic devices shown in FIGS. 10(*a*) through 10(*c*) include the liquid crystal display apparatus of the embodiment described above, and therefore possess improved quality and performance.

The electronic devices of the present embodiment described above include a liquid crystal apparatus. However, electronic devices of the present invention can include an organic electroluminescence display apparatus, a plasma display apparatus, or another such electrooptical apparatus.

Second Embodiment

Next, the second embodiment of the present invention will be described with reference to FIGS. 11 and 12. In view of the similarity between the first and second embodiments, the parts of the second embodiment that are identical to the parts of the first embodiment will be given the same reference numerals as the parts of the first embodiment. Moreover, the descriptions of the parts of the second embodiment that are identical to the parts of the first embodiment may be omitted for the sake of brevity.

Figure 11:
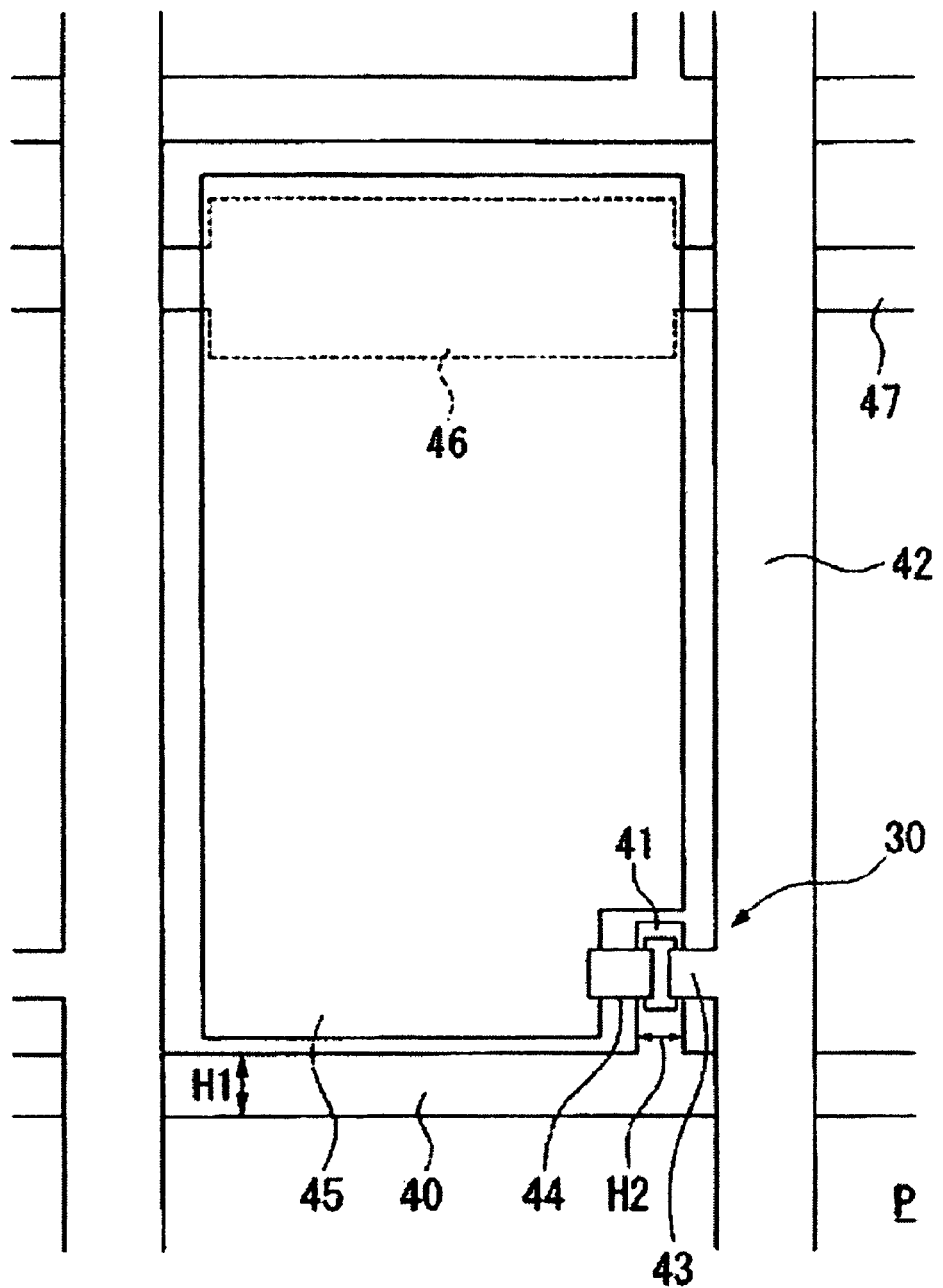
FIG. 11 is a plan view showing the configuration of a TFT array substrate formed by the wiring method of the second embodiment of the present invention.

FIG. 11 is a plan view showing the schematic configuration of a TFT array substrate P on which an accumulation and storage capacity wiring 47 and an accumulation and storage capacity 46, which is part of the accumulation and storage capacity wiring 47, are formed by the wiring method of the second embodiment of the present invention.

As shown in the diagram, the accumulation and storage capacity wiring 47 is formed on the TFT array substrate P of the second embodiment so as to extend parallel to the X-axis direction of the gate wiring 40. This accumulation and storage capacity wiring 47 is formed in a groove (not shown in FIG. 11) that is formed in the bank B in the same manner as in the case of the gate wiring 40, such that the accumulation and storage capacity wiring 47 is formed on the same layer as the gate wiring 40. Also, part of the accumulation and storage capacity wiring 47, specifically, the region located underneath the pixel electrodes 45, is formed to be wide, and this widely formed region is configured as the accumulation and storage capacity 46. An insulating film formed in the same step as the gate insulating film 613 is disposed between the accumulation and storage capacity 46 and the pixel electrodes 45.

As a result of additionally forming such accumulation and storage capacity 46, the voltage from the pixel electrodes 45 is retained by the accumulation and storage capacity 46 for a period longer by three digits than the period during which the source voltage is applied. Therefore, the electric charge retaining characteristics of the TFT array substrate P can be improved. Consequently, it is possible to improve the contrast ratio of the electrooptical apparatus having such TFT array substrate P.

The accumulation and storage capacity wiring 47 described above is formed by the wiring method of the present embodiment in the same step as the gate wiring 40.

Figure 12:
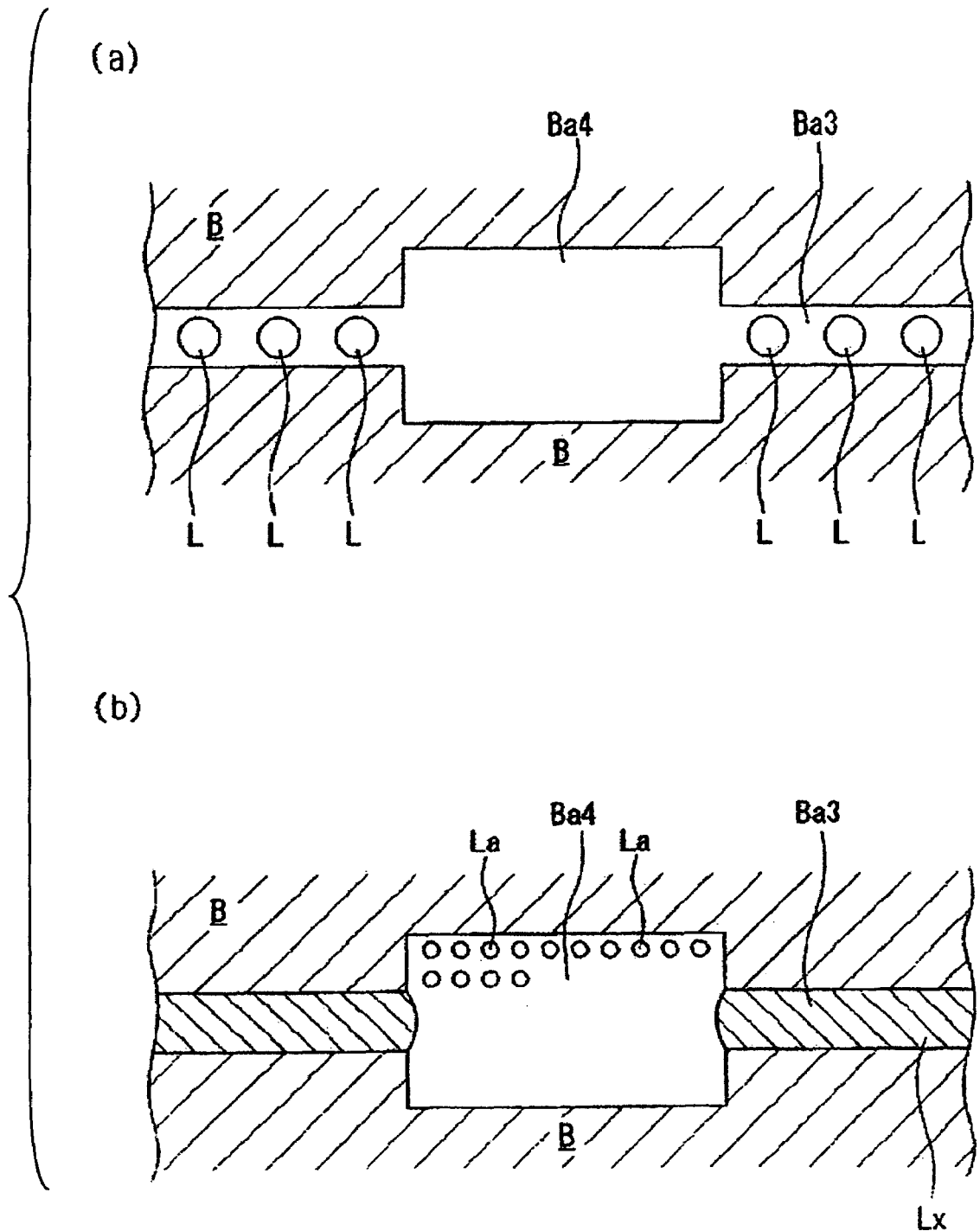
FIGS. 12(*a*)-(*b*) are diagrams for showing the wiring method of the second embodiment of the present invention.

Specifically, as shown in FIG. 12(*a*), a functional liquid L containing the material for forming the gate wiring 40 is ejected using the droplet ejection method and deposited in an accumulation and storage capacity wiring formation section Ba3 (another example of the wiring formation area) that is defined by the bank B.

Then, droplets La that are smaller in amount of than the droplets ejected and deposited in the accumulation and storage capacity wiring formation section Ba3 are ejected using the droplet ejection method and deposited in an accumulation and storage capacity formation section Ba4 (another example of the secondary area), as shown in FIG.

12(b). The per unit area amount of functional liquid La deposited in the accumulation and storage capacity formation section Ba4 is thereby smaller than the per unit area amount of the functional liquid L deposited in the accumulation and storage capacity wiring formation section Ba3. Therefore, the thickness of the liquid film deposited on the accumulation and storage capacity formation section Ba4 is smaller than the thickness of the liquid film deposited on the accumulation and storage capacity wiring formation section Ba3.

Then, the accumulation and storage capacity wiring 47 and the accumulation and storage capacity 46 that is configured as a portion of the accumulation and storage capacity wiring 47 are formed by subjecting the droplets of the functional liquids L and La to an intermediate drying step and a heating treatment and/or a light treatment. The accumulation and storage capacity 46 thus formed is located underneath the top surfaces of the bank B, similar to the gate electrode 41. Consequently, the thickness of the insulating film deposited on the accumulation and storage capacity 46 can be greater than the thickness of the insulating film deposited on the rest of the accumulation and storage capacity wiring 47.

Therefore, according to the wiring method of the second embodiment, it is possible to reduce the occurrence of insufficient insulation between the accumulation and storage capacity 46 and the pixel electrodes 45, even when a thin insulating film is used in order to improve the productivity of the TFT array substrate P.

Also, according to the wiring method of the second embodiment, the liquid film disposed on the accumulation and storage capacity formation section Ba4 can be easily made thinner than the liquid film disposed on the accumulation and storage capacity wiring formation section Ba3 by ejecting and depositing a smaller amount of the functional liquid La onto the accumulation and storage capacity formation section Ba4 than the amount of the functional liquid L deposited on the accumulation and storage capacity wiring formation section Ba3 using a droplet ejection method. Consequently, an accumulation and storage capacity 46 having a reduced thickness can be formed by subjecting the functional liquids L and La to the intermediate drying treatment as well as the heating treatment and/or the light treatment.

To prevent the liquid films from having the same thickness due to leveling of the functional liquid L deposited on the accumulation and storage capacity wiring formation section Ba3 and the functional liquid La deposited on the accumulation and storage capacity formation section Ba4, it is preferable to eject and deposit the functional liquid La onto the accumulation and storage capacity formation section Ba4 after the intermediate drying treatment is applied and the functional liquid L that has been ejected and deposited onto the accumulation and storage capacity wiring formation section Ba3 is solidified to form a dried film Lx, as shown in FIG. 12(b).

The preferred embodiments of the wiring method in accordance with the present invention were described above with reference to the accompanying diagrams, but the present invention is obviously not limited to these examples. The shapes and combinations of the structural components shown in the examples described above are merely examples, and various modifications are possible on the basis of the design requirements within a range that does not deviate from the scope of the present invention.

For example, in the embodiments described above, the TFTs 30 are all configured as bottom gate TFTs. However, rather than being applied solely to the formation of gate wiring for bottom gate TFTs, the wiring method of the present invention can also be applied to the formation of gate wiring for top gate TFTs.

Also, in the second embodiment described above, the accumulation and storage capacity 46 is configured as part of the accumulation and storage capacity wiring 47 that is formed separately from the gate wiring 40. However, the wiring method of the present invention can also be applied to a case where a part of the gate wiring is formed to be wide, and this widened part is configured as the accumulation and storage capacity, for example.

As used herein, the following directional terms "forward, rearward, above, downward, vertical, horizontal, below and transverse" as well as any other similar directional terms refer to those directions of a device equipped with the present invention. Accordingly, these terms, as utilized to describe the present invention should be interpreted relative to a device equipped with the present invention.

The term "configured" as used herein to describe a component, section or part of a device includes hardware and/or software that is constructed and/or programmed to carry out the desired function.

Moreover, terms that are expressed as "means-plus function" in the claims should include any structure that can be utilized to carry out the function of that part of the present invention.

The terms of degree such as "substantially", "about" and "approximately" as used herein mean a reasonable amount of deviation of the modified term such that the end result is not significantly changed. For example, these terms can be construed as including a deviation of at least ±5% of the modified term if this deviation would not negate the meaning of the word it modifies.

This application claims priority to Japanese Patent Application No. 2004-198037. The entire disclosure of Japanese Patent Application No. 2004-198037 is hereby incorporated herein by reference.

While only selected embodiments have been chosen to illustrate the present invention, it will be apparent to those skilled in the art from this disclosure that various changes and modifications can be made herein without departing from the scope of the invention as defined in the appended claims. Furthermore, the foregoing descriptions of the embodiments according to the present invention are provided for illustration only, and not for the purpose of limiting the invention as defined by the appended claims and their equivalents. Thus, the scope of the invention is not limited to the disclosed embodiments.

What is claimed is:

1. A method of forming a wiring in a thin-film transistor, the wiring method comprising the steps of:
   providing a bank having a groove defined thereon, the groove having a wiring formation area and a secondary area that is contiguously connected with the wiring formation area;
   placing a liquid material in the wiring formation area by depositing droplets of the liquid material, the liquid material containing a structural material for the wiring;
   placing the liquid material in the secondary area, a per unit amount of the liquid material placed in the secondary area being smaller than a per unit amount of the liquid material deposited in the wiring formation area;
   drying the liquid material in the wiring formation area; and
   drying the liquid material in the secondary area, wherein a film of the liquid material in the wiring formation area is thicker than a film of the liquid material in the secondary area.

2. The wiring method according to claim 1, wherein
the wiring formation area is a gate wiring of the thin film transistor, and
the secondary area is a gate electrode of the thin film transistor.

3. The wiring method according to claim 1, wherein
the secondary area is an accumulation and storage capacity of the thin film transistor.

4. The wiring method according to claim 3, wherein
the wiring formation area is an accumulation and storage capacity wiring of the thin film transistor.

5. The wiring method according to claim 1, wherein
in the placing of the liquid material in the secondary area, the liquid material is placed in the secondary area by the liquid material deposited in the wiring formation area flowing into the secondary area due to the fluidity of the liquid material.

6. The wiring method according to claim 1, wherein
in the placing of the liquid material in the secondary area, the liquid material is placed in the secondary area by depositing droplets of the liquid material that are smaller than the droplets of the liquid material deposited in the wiring formation area.

7. The wiring method according to claim 1, wherein
the placing of the liquid material in the secondary area is performed after the drying of the liquid material in the wiring formation area, and
in the placing of the liquid material in the secondary area, the liquid material is placed in the secondary area by depositing droplets of the liquid material that arc smaller than the droplets of the liquid material deposited in the wiring formation area.

8. The wiring method according to claim 1, further comprising the step of:
placing an insulating film over the wiring formation area and the secondary area, a thickness of the insulating film over the wiring formation area being smaller than the thickness of the insulating film over the secondary area.

* * * * *